US006989336B2

(12) United States Patent
Meth et al.

(10) Patent No.: US 6,989,336 B2
(45) Date of Patent: Jan. 24, 2006

(54) PROCESS FOR LAMINATING A DIELECTRIC LAYER ONTO A SEMICONDUCTOR

(75) Inventors: Jeffrey Scott Meth, Landenburg, PA (US); Kenneth George Sharp, Landenburg, PA (US); Robert Clayton Wheland, Wilmington, DE (US); Geoffrey Nunes, Swarthmore, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 15 days.

(21) Appl. No.: 10/949,632

(22) Filed: Sep. 24, 2004

(65) Prior Publication Data

US 2005/0130443 A1 Jun. 16, 2005

Related U.S. Application Data

(60) Provisional application No. 60/505,880, filed on Sep. 24, 2003.

(51) Int. Cl.
*H01L 21/31* (2006.01)
*H01L 21/00* (2006.01)
*H01L 21/3205* (2006.01)

(52) U.S. Cl. .......................... 438/780; 438/66; 438/99; 438/149; 438/151; 438/591; 438/758

(58) Field of Classification Search ................ 438/591, 438/149, 151, 99, 66, 299, 758, 457, 780
See application file for complete search history.

(56) References Cited

U.S. PATENT DOCUMENTS

| | | | | |
|---|---|---|---|---|
| 6,403,396 | B1 | 6/2002 | Gudesen et al. | |
| 6,468,841 | B2 * | 10/2002 | Muramatsu et al. | 438/150 |
| 6,555,411 | B1 | 4/2003 | Bao et al. | |
| 6,596,569 | B1 | 7/2003 | Bao et al. | |
| 2002/0076575 | A1 | 6/2002 | Yang et al. | |
| 2002/0127877 | A1 * | 9/2002 | Shibata et al. | 438/780 |
| 2003/0034497 | A1 * | 2/2003 | Yamazaki et al. | 257/86 |
| 2003/0207545 | A1 * | 11/2003 | Yasukawa | 438/149 |
| 2004/0110395 | A1 * | 6/2004 | Ueda et al. | 438/795 |

OTHER PUBLICATIONS

Scott Miller et. al., Direct Printing of Polymer Microstructures on Flat and Spherical Surfaces Using a Letterpress Technique, Journal of Vacuum Science and Technology B, 2002, pp. 2320-2327, vol. 20.

Dawen Wang et. al., Nanometer Scale Patterning and Pattern Transfer on Amorphous SI, Crystalline SI, and SIO2 Surfaces Using Self-Assembled Monolayers, Appl. Phys. Lett., 1997, pp. 1593-1595, vol. 70.

C.J. Drury, et al., "Low-cost all-polymer integrated circuits", Appl. Phys. Letter. (1998), pp. 108-110, vol. 73, No. 1, Netherlands.

V. Podzorov, et al., "Field-effect transistors on rubrene single crystals with parylene gate insulator", Applied Physics Letters, (2003), pp. 1739-1741, vol. 82, No. 11, New Jersey.

* cited by examiner

*Primary Examiner*—Ha Nguyen
*Assistant Examiner*—Cheung Lee

(57) ABSTRACT

This invention relates to processes useful for fabricating electronic devices, more particularly to a process for laminating a layer of dielectric material onto a semiconductor.

5 Claims, 4 Drawing Sheets

Figure 1 – Schematic of a DIGFET
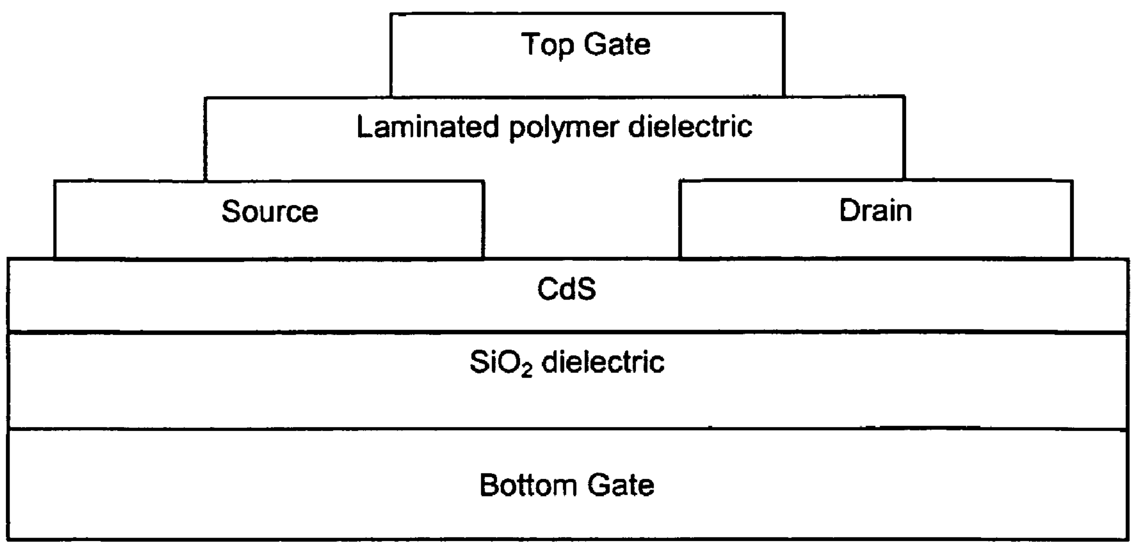

Figure 2a – Plot of Bottom-gate Drain Current Characteristics for a DIGFET Before Lamination of the Dielectric
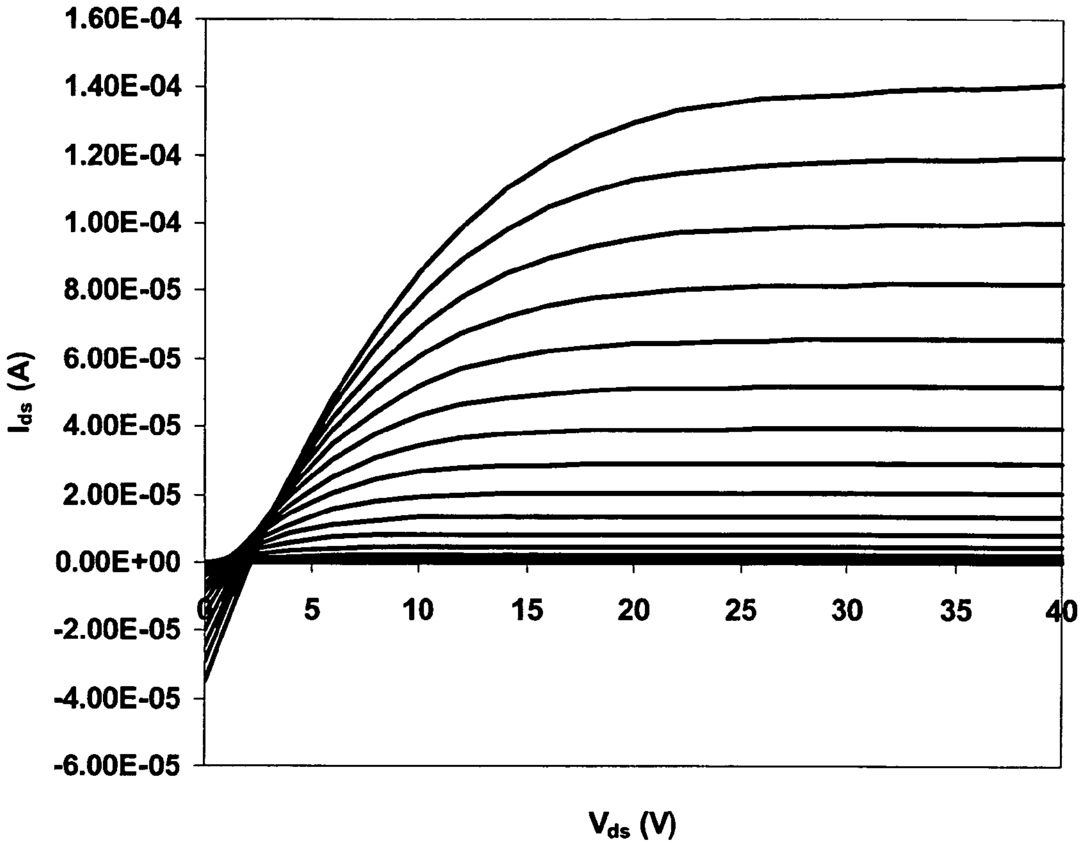

Figure 2b – Plot of Bottom-gate Drain Current Characteristics of the Same DIGFET After Lamination of the Dielectric
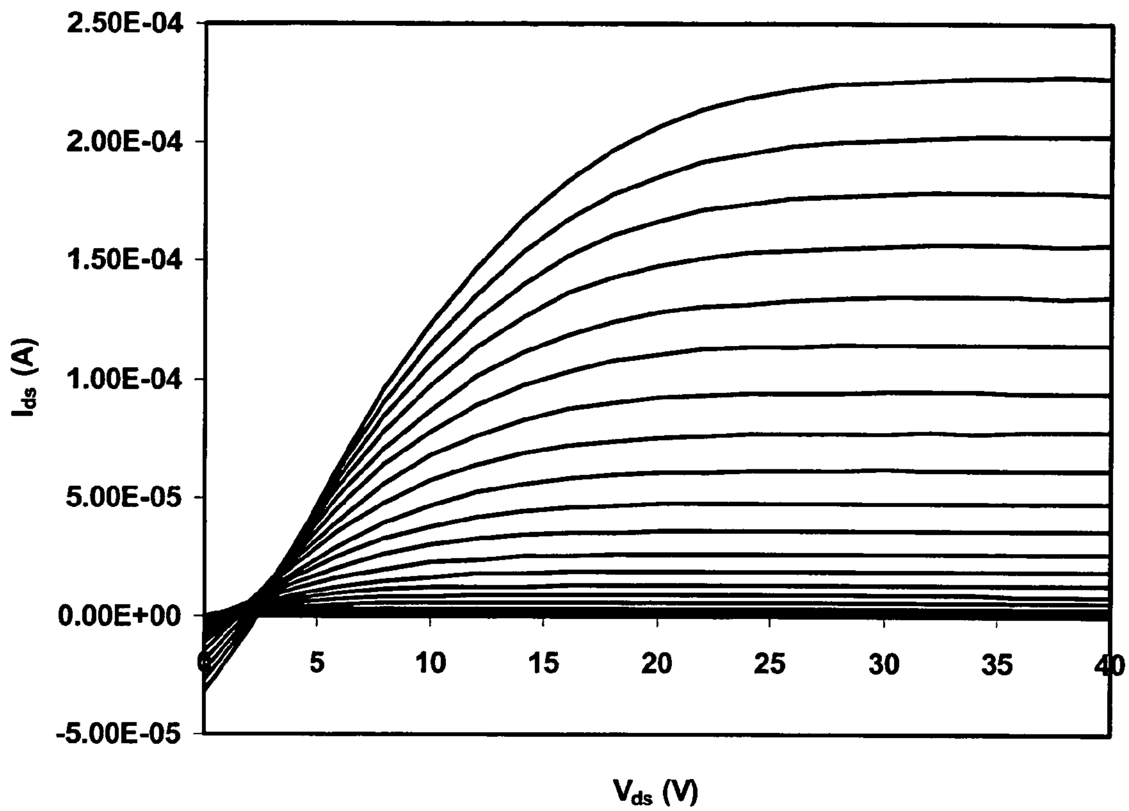

Figure 2c – Plot of the Top-gate Behavior of the Same DIGFET
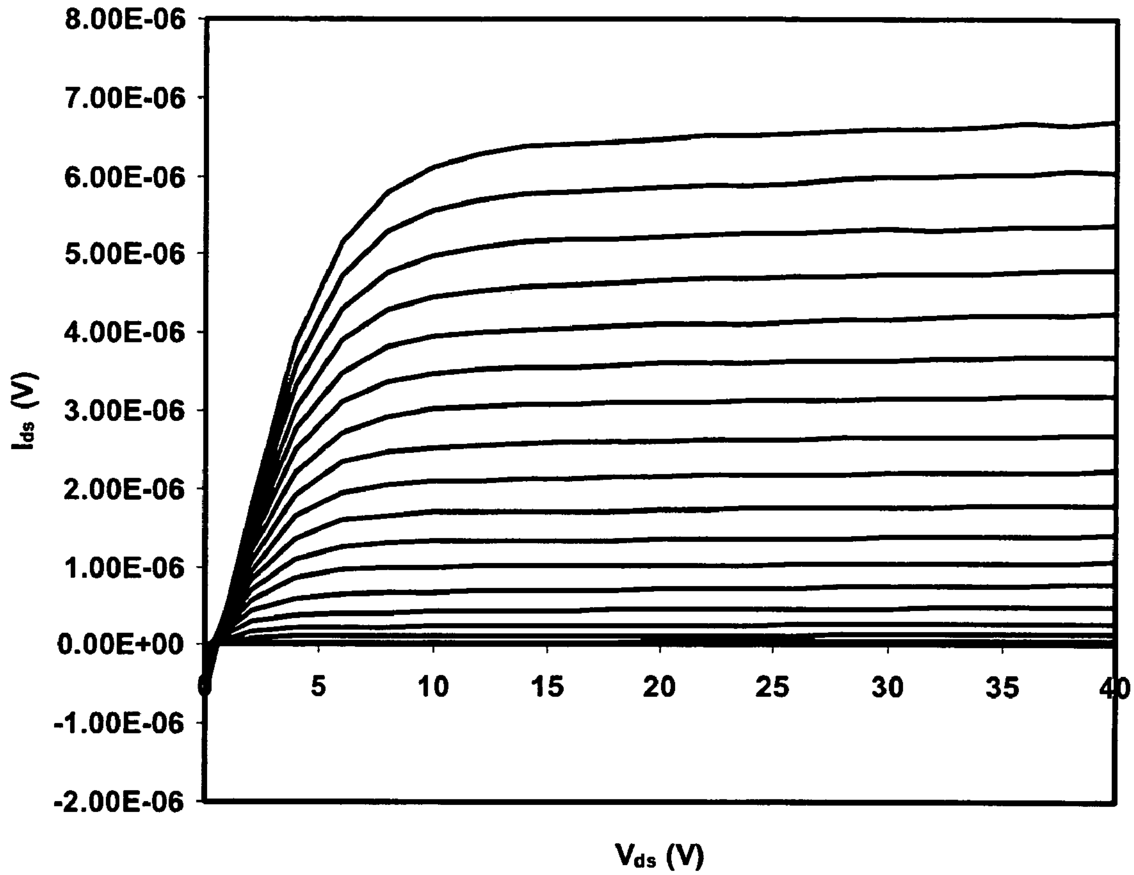

PROCESS FOR LAMINATING A DIELECTRIC LAYER ONTO A SEMICONDUCTOR

FIELD OF THE INVENTION

This invention relates to processes useful for fabricating electronic devices, more particularly to a process for laminating a layer of dielectric material onto a semiconductor.

TECHNICAL BACKGROUND OF THE INVENTION

Thin film transistor (TFT) arrays for flat-panel displays are typically fabricated using amorphous-silicon-on-glass technology. Emerging display applications, such as electronic paper or remotely-updateable posters, will require TFT arrays on flexible substrates fabricated over very large areas, features which are difficult to achieve with amorphous silicon devices. In addition, these new applications will only gain wide acceptance if they can be produced at a significantly lower cost than current capital-intensive techniques allow. Consequently, there is significant interest in printable electronics as a low-cost fabrication technique compatible with large areas and flexible substrates. A common feature to most of these techniques is that the critical semiconductor-gate dielectric interface is formed by deposition of the semiconductor onto the dielectric. C. J. Drury et al., Appl. Phys. Lett., 73 (1998) 108–110 disclose the application of the dielectric via spin-coating to a poly(thienylenevinylene) semiconductor which had been cast from a precursor solution and then cured, rendering it insensitive to the solvent carrier for the dielectric layer. Podzorov et al., Appl. Phys. Lett. 82 (2003) 1739, disclose the deposition of parylene from the gas phase onto a single crystal of rubrene, a process which does not dramatically affect the semiconductor, but which also does not provide much latitude in the choice of dielectric material. In general, the use of solvent-based deposition of materials onto semiconducting layers has been avoided because the applied solvent can compromise the integrity of the semiconductor.

As an alternative approach, lamination offers a solvent-free method for transferring a wide range of polymer dielectrics onto a variety of semiconductors. Lamination is a dry process, can be applied over large areas, and is compatible with many of the proposed features of printable electronic technology, e.g. roll-to-roll processing. However, until now, a variety of technical challenges had prevented lamination from being a viable approach.

SUMMARY OF THE INVENTION

This invention provides a process for laminating a layer of dielectric material onto a semiconductor comprising:

a. coating a first surface of a flexible substrate with a cushion layer comprising an elastomer to form a backing layer;
b. coating the cushion layer with a dielectric material to form a donor element comprising the substrate, the cushion layer and the dielectric material, wherein the dielectric material has a Tg below a lamination temperature;
c. placing the dielectric material of the donor element in contact with a semiconductor;

d. applying heat and pressure to a second surface of the substrate of the donor element to adhere the dielectric material to the semiconductor thereby transferring the dielectric material to the semiconductor; and
e. optionally removing the backing layer.

BRIEF DESCRIPTION OF THE FIGURES

FIG. 1 is a schematic of a DIGFET

FIG. 2*a* is a plot of the bottom-gate drain current characteristics of a DIGFET before lamination of the dielectric FIG. 2*b* is a plot of the bottom-gate behavior of the same DIGFET after lamination of the dielectric FIG. 2*c* is a plot of the top-gate behavior of the same DIGFET

DETAILED DESCRIPTION OF THE INVENTION

The process of this invention is useful in the production of thin film transistors (TFTs). The process provides a method for laminating dielectric materials onto semiconductors by first coating a cushion layer onto a flexible substrate to form a backing layer. The dielectric material is then coated onto the cushion layer to form the donor element. The dielectric material of the donor element is then placed in contact with the semiconductor layer, and sufficient heat and pressure are applied in a lamination step to cause the elastomer to soften or partially melt and the dielectric material to adhere to the semiconductor material. While the elastomer is still soft, the backing layer can be removed, if desired.

To illustrate the use of this process, the fabrication of TFTs in which a polymer dielectric is laminated to a cadmium sulfide semiconducting layer is described. Fused silica substrates, measuring 25 mm×50 mm×1 mm, were stamped with a fluorosilane monolayer such that most of the substrate became hydrophobic. Ten 1 $mm^2$ patches remained hydrophilic. It was onto these areas that the CdS was deposited via CBD (chemical bath deposition). Aluminum source/drain electrodes were evaporated onto the samples. The polymer dielectric was then laminated onto the sample. Finally, aluminum gate electrodes were evaporated, completing the TFT structure.

Suitable flexible substrates for the donor element include polymer films and sheets, as well as metal sheets and films. Suitable polymers include polyesters, polyamides, polyimides, polycarbonates and other materials that can be formed into sheets or films and are thermally and dimensionally stable at the lamination temperature. Dimensionally stabilized PET and polyimide films (e.g., Kapton®, DuPont) are preferred.

Suitable materials for the cushion layer include elastomers with softening temperatures between 40 C and the decomposition temperature of the flexible substrate or the dielectric material, whichever is lower. Elvax® is a preferred elastomer.

Suitable dielectrics for use in the process of this invention include polymers with Tg (glass transition temperature) less than the lamination temperature and a dielectric constant of 3–10. Suitable dielectric materials must also be flexible enough to transfer without cracking. Preferred polymers include PBMA (polybutylmethacrylate), PVP (polyvinylpyridine), PTFEVFP (poly (tetrafluoroethylene-co-vinylidene fluoride-co-propylene)) and PVFMVE (poly(vinylidene fluoride-co-perfluoromethylvinylether)). Fluorinated polymers such as PVFMVE are especially preferred due to their high dielectric constants.

In selected combinations of substrate and dielectric polymer, it may be possible to carry out the lamination step without use of a cushion layer.

The ability to laminate a gate-dielectric offers a new route to the fabrication of thin-film transistors. Since lamination is compatible with roll-to-roll processing and other high-throughput manufacturing methods, laminated dielectrics may enable the fabrication of large area, low cost electronics.

EXAMPLES

Microcontact Printing

A PDMS (polydimethylsiloxane) stamp was fabricated from a photolithographic master on a silicon wafer using SU-8 as a negative resist with a thickness of 26 microns. The resist was imaged through a film phototool. The master was cut to the desired size, and then bonded onto a glass plate using epoxy glue. Dow Corning Sylgard 184 (10:1 ratio of polymer to curing agent) was degassed for ~30 min. in a vacuum oven at room temperature. A Teflon O-ring was placed around the master to confine the fluid to be crosslinked into the stamp. Sylgard 184 fluid was poured gently onto the master to fill the area within the O-ring. A glass plate treated with a soluble fluoropolymer was used to define the upper surface of the silicone. A uniform weight of ~200 g. is kept on this glass plate as the fluid was cured into an elastomer. Cure took place at a temperature of 60° C. for at least 5 hours. The stamp was then carefully peeled apart from the master surface.

The cured stamp was spin coated (at 2000 rpm) with 10 mM (heptadecafluoro-1,1,2,2-tetrahydrodecyl) trichlorosilane in perfluoro(butyl-tetrahydrofuran) [Fluoroinert FC-75] solvent. The fluorosilane-coated stamp was dried with $N_2$ gas before printing the hydrophobic background pattern on the substrate. The stamp was held from one corner with a pair of forceps. It was carefully placed on the substrate starting from the bottom edge and slowly moved in the upward direction until whole of the stamp was in full contact with the substrate. A small sheet of Teflon (the size of the stamp) was placed on the stamp, followed by a round steel weight that was big enough to cover the stamp. This was done to provide uniform pressure on the stamp and assure that it was in full contact with the substrate. The weight was carefully removed, followed by the Teflon sheet. The stamp was removed from the substrate by using forceps, starting from the bottom edge and slowly detaching it in the upward direction so that the stamp did not slip during the detachment procedure. After microcontact printing, the substrate was placed in the CBD bath.

Chemical Bath Deposition

The CBD baths consisted of 30 mM triethanolamine, 6 mM cadmium acetate, and 6 mM thiourea, held at a temperature of 70° C., pH=9. A piece of gold foil was included in the bath. We found that the inclusion of gold foil in the bath reduced the conductivity of the deposited films. The samples, after removal, were washed with copious amounts of DI water, dried under a stream of nitrogen, and dried on a hotplate at 70° C.

Surface Treatments

Surface treatments of the CdS films prior to evaporation of the source/drain pairs were accomplished with the aid of a UVOCS cleaning unit or a plasma oven. When a fluorosilane surface modifier was used to pattern CdS deposition, a large portion of the surface exhibited low surface energy, interfering with lamination of the dielectric. To remove the fluorosilane, the surface was treated with either a UV-Ozone cleaning system (UVOCS) or oxygen plasma (300W). Both methods successfully cleaned the surface as determined by observing the wetting of a water drop. After cleaning, lamination occurred without a problem.

Source and Drain Electrodes

Aluminum source and drain electrodes were evaporated, at a base pressure of ~$5\times10^{-6}$ mbar, through a shadow mask onto the CdS film. Aluminum was chosen for the source and drain contacts because it can make ohmic contact to CdS. The mask defined twelve sets of source-drain pairs, each with a channel width W=500 □m wide, and three different channel lengths, L, four each of L=20, 50 and 100 □m. After evaporation, the samples were annealed in an oven with nitrogen purge at 250° C. for 2 hours.

Lamination

Elvax® (an ethylene/vinyl acetate copolymer) was extruded onto Cronar® (a dimensionally stabilized poly (ethylene terephthalate) (PET) sheet) to a thickness of 2 mils. This sheet was used as the substrate upon which polymer solutions were bar-coated with Meyer rods. The softening temperature of the Elvax® is ~80° C. Solutions of the dielectric materials of 5–10 wt % were coated with rods varying from #5–#20, to produce polymer films with thicknesses ranging from 0.2–1.5 □m on the Elvax®/Cronar® substrates, which were approximately 1 $ft^2$ in area. Small strips ($5\times30$ $mm^2$) of these sheets were cut out and placed over the source-drain gaps on the fused silica substrates. The sample was then sandwiched between Teflon® sheets, which were then sandwiched between silicone rubber sheets. The assembly was then placed into a Carver press preheated to 85° C. The press was then closed with a force of 1000–2000 lbs over the 36 $in^2$ platens, and the sample was held there for 2 minutes. Upon opening the press, the Elvax®/Cronar® substrate is peeled back while the sample is still warm. A clean separation between the polymer coating and the Elvax® occurs practically every time, resulting in complete transfer of the thin polymer film to the substrate. Multiple laminations of thin films can be performed in this fashion, with zero back transfer.

Gate Electrodes

Aluminum gate electrodes were then evaporated onto the polymer dielectric, completing the TFT structure.

Device Testing

Transfer curves (gate sweeps), composed of $I_{ds}$ vs. $V_g$ traces at a fixed $V_{ds}$, were measured as well as the output curves, $I_{ds}$ vs. $V_{ds}$ as a function of $V_g$. Linear and saturated transfer curves were obtained. Typical TFT behavior was observed. The relevant parameters were extracted from the data using standard TFT analysis.

Example 1

Poly(butylmethacrylate)–PBMA

Table 1 summarizes the results for a typical sample. The PBMA thickness d=1.8 □m, and we assumed a dielectric constant k=3.5 was applicable for these experiments. The linear gate sweeps were obtained with $V_{ds}$=1 V, and the saturated gate sweeps were obtained with $V_{ds}$=100 V. In both cases, $V_g$ was swept from −100 to +100 V in 0.5 V increments. A Levinson analysis of the linear gate sweep was performed, and the grain boundary mobility $□_{gb}$ and the trap density $N_t$ are included in Table 1. Overall, the agreement in □ for the different measurements was good, within the standard deviation.

TABLE 1

| PBMA (30-2), N = 10 | □ × $10^{-2}$) (cm²/Vs) | $V_t$ | $□_{gb}$ (×$10^{-2}$) (cm²/Vs) | $N_t$ (×$10^{12}$) (#/cm²) | On/off ratio |
|---|---|---|---|---|---|
| Linear GS | 1.6 ± 0.3 | 57 ± 6 | 2.7 ± 0.8 | .91 ± .14 | 3.5 ± $10^4$ |
| Saturated GS | 1.7 ± 0.5 | 46 ± 6 | | | 5.6 ± $10^6$ |
| Output curve, linear region | 1.7 ± 0.4 | 67 ± 2 | | | |
| Output curve, saturated region | 1.6 ± 0.7 | 49 ± 3 | | | 2.8 ± $10^4$ |

Example 2

Poly(4-vinylpyridine)—PVP

PVP (MW=60,000; 10 wt % solution in methyl ethyl ketone; dielectric constant, k=3.8 at 200 Hz) was bar-coated onto Elvax®/Cronar® using a #10 rod, resulting in a film with d=1.6 □m thick. The CdS sample was treated in the UVOCS for 15 mins, and then annealed at 250° C. overnight. Aluminum source/drain electrodes were evaporated onto the CdS. Then a single layer of PVP was laminated onto the sample. Aluminum gate electrodes were then evaporated onto this structure.

The data from this sample is collected in Table 2. There is very good agreement between the mobility values extracted from the output and transfer curves.

TABLE 2

| PVP (24-1), N = 8 | □ × $10^2$) (cm²/Vs) | $V_t$ | □ (×$10^2$) Grain boundary (cm²/Vs) | $N_t$ (×$10^{12}$) (#/cm²) | On/off ratio |
|---|---|---|---|---|---|
| Linear GS | 1.2 ± 0.2 | 46 ± 3 | 1.7 ± 0.3 | .87 ± .11 | 2.7 × $10^4$ |
| Saturated GS | 1.4 ± 0.2 | 45 ± 7 | | | 3.3 × $10^5$ |
| Output curve, linear region | 1.7 ± 0.4 | 64 ± 4 | | | |
| Output curve, saturated region | 1.2 ± 0.2 | 45 ± 5 | | | 2.8 × $10^4$ |

Example 3

Poly(vinylidene fluoride-co-perfluoromethyl vinyl ether)—PVFMVE

Poly(vinylidene fluoride-co-perfluoromethylvinylether) (dielectric constant k=10 at 40 Hz) was coated to 0.5 mm thickness by drawing a 10 wt % solution of the polymer in methyl ethyl ketone onto an Elvax®/Cronar® receiver sheet with a #8 Meyer rod. The results from several experiments are presented in Table 3.

TABLE 3

| Sample | Treatment | Dielectric Thickness (□m) | $□_{lin}$ (cm²/Vs) | $□_{sat}$ (cm²/Vs) | Sat. On/off (median) | Sat. $V_t$ |
|---|---|---|---|---|---|---|
| 104932-015 | UVOCS | 1.5 | 0.74 | 0.98 | 4.8 × $10^3$ | 12.4 |
| 104932-074-1 | UVOCS | 0.84 | — | 0.20 | 3.0 × $10^5$ | 23.5 |
| 104932-074-2 | $O_2$ plasma | 1.0 | 0.64 | 8.9 | 1.1 × $10^6$ | 14.9 |
| 104932-085-3 | UVOCS | 1.7 | 1.0 | 2.4 | 1.1 × $10^4$ | 27.9 |
| 104932-085-4 | Ar plasma | 1.7 | 0.60 | 2.0 | 8.0 × $10^3$ | 22.3 |
| 104932-096-2 | $O_2$ plasma | 1.6 | 0.54 | 1.0 | 5.2 × $10^1$ | −2.3 |
| 104932-096-3 | Ar plasma | 1.6 | 0.15 | 0.36 | 1.5 × $10^3$ | 29.8 |
| 104932-096-5 | UVOCS | 1.6 | 0.13 | 0.40 | 7.3 × $10^3$ | 20.7 |
| 104932-105-1 | Ar plasma | 1.7 | 0.12 | 0.33 | 4.5 × $10^3$ | 27.7 |
| 104932-105-2 | $O_2$ plasma | 1.7 | 0.49 | 1.2 | 5.0 × $10^3$ | 30.8 |
| 104932-105-3 | UVOCS | 1.7 | 0.17 | 0.38 | 3.0 × $10^2$ | 21.1 |

We examined the time dependent polarization of the dielectric by performing saturated gate sweeps as a function of delay time and number of data points. These results are collected in Table 4. For all data, $V_{ds}$=50 V, and $V_g$ was swept from −50 to +50. The initial hold time on the semiconductor parameter analyzer was kept constant at 5 s, and the integration time was set for medium. The dielectric thickness d=1.5 □m. As the delay time decreased, the mobility remained the same, the on/off ratio decreased, and the threshold voltage increased.

TABLE 4

| Delay Time (s) | # pts | Peak mobility □ (cm²/Vs) | On/off | $V_t$ |
|---|---|---|---|---|
| 0.2 | 400 | 1.2 | 1.1 × $10^7$ | 7 |
| 0.1 | 400 | 1.4 | 5.5 × $10^7$ | 10 |

TABLE 4-continued

| Delay Time (s) | # pts | Peak mobility □ ($cm^2$/Vs) | On/off | $V_t$ |
|---|---|---|---|---|
| 0.01 | 400 | 1.4 | $7.3 \times 10^6$ | 17 |
| 0.001 | 400 | 1.5 | $7.0 \times 10^6$ | 19 |
| 0.0001 | 400 | 1.6 | $7.0 \times 10^6$ | 19 |
| 0.0001 | 200 | 2.0 | $3.2 \times 10^6$ | 26 |
| 0.0001 | 100 | 1.5 | $1.1 \times 10^6$ | 29 |

Example 4

Poly(tetrafluoroethylene-co-vinylidene fluoride-co-propylene)

Poly(tetrafluoroethylene-co-vinylidene fluoride-co-propylene) (PTFEVFP) is soluble in common organic solvents and has a relatively large dielectric constant, k=6 at 100 Hz. The low glass transition temperature, $T_g$=−20° C., made lamination very easy. Poling of the dielectric under the influence of the gate field resulted in artificially enhanced mobility values. These are evidenced in Table 5.

Example 5

Production of DIGFETs via a Lamination Process

The DIGFET (double insulated-gate field-effect transistor) devices were fabricated on n++ Si wafers with 100 nm thermal oxide on the top surface and a Ti/Au back contact. The wafers were cleaved into ~2 cm wide strips, washed with methanol and DI water, blown dry with $N_2$ gas, and cleaned in an oxygen plasma (3 scfh,. 200 W) for 3 minutes. Cadmium sulfide was deposited onto the $SiO_2$ surface by placing the substrates in a Teflon PFA® breaker containing a basic (pH=9) solution of 2.5 millimolar cadmium acetate, 2.5 millimolar thiourea, and 25 millimolar triethanolamine. The beaker was placed on a hot plate/stirrer to maintain a constant temperature of 74° C. The solution was prepared using cadmium acetate hydrate (99.99+%), thiourea (99+%), and triethanolamine (98%) purchased from Aldrich and used without further purification in deionized water (□~$10^{18}$ □-cm). The thickness of the CdS film was controlled by how long the substrates were kept in the bath, with a typical 15 minute deposition resulting in a 15±5 nm thick (as determined with a stylus profilometer) CdS film.

TABLE 5

| Sample | Treatment | Dielectric Thickness (□m) | $□_{lin}$ ($cm^2$/Vs) | $□_{sat}$ ($cm^2$/Vs) | Sat. On/off (median) | Sat. $V_t$ |
|---|---|---|---|---|---|---|
| 103172-154-1 | UVOCS | 1.4 | 2.3 | 3.0 | $2.8 \times 10^4$ | 12 |
| 103172-154-2 | $O_2$ plasma | 1.4 | 3.9 | 20 | $2.3 \times 10^5$ | 9.7 |
| 103172-154-7 | $O_2$ plasma | 1.4 | 11.3 | 90 | $5.8 \times 10^3$ | 5.1 |
| 103172-154-3 | Ar plasma | 1.4 | 9.3 | 32 | $5.4 \times 10^2$ | 8.5 |

To demonstrate poling of the dielectric, we measured transfer curves on device 7 of 154–3 (L=50 □m, W=500 □m) by sweeping $V_g$ from −20 V to +20 V with $V_{ds}$=20 V, and varied the delay time. The hold time was held constant at 60 s, the integration time was short, and there were 400 points per scan. The results are summarized in Table 6. We see a pronounced decrease in the measured mobility and the on/off ratio, while $V_t$ was little affected.

TABLE 6

| Delay Time (s) | Mobility □ ($cm^2$/Vs) | On/off | $V_t$ |
|---|---|---|---|
| 2 | 45 | $5.2 \times 10^6$ | 11 |
| 1 | 18 | $1.6 \times 10^6$ | 10 |
| .5 | 7.1 | $6.5 \times 10^7$ | 10 |
| .2 | 2.5 | $2.4 \times 10^6$ | 10 |
| .1 | 1.2 | $5.2 \times 10^5$ | 11 |
| .05 | .48 | $1.9 \times 10^5$ | 11 |
| .01 | .063 | $1.3 \times 10^4$ | 9 |
| .001 | .017 | $2.3 \times 10^4$ | 6 |
| .0001 | .018 | $1.2 \times 10^3$ | 6 |

After deposition of the semiconductor, the samples were annealed at 250° C. for 12 hours. Then aluminum source and drain electrodes were deposited onto the CdS film by thermal evaporation through a shadow mask. The mask defined twelve sets of source-drain pairs, each with a channel width W=500 □m, and three different channel lengths L=20, 50, and 100 □m.

At this point, the bottom-gate transistors were complete, and their characteristics were checked prior to fabrication of the final DIGFET structure. An Agilent 4155C semiconductor parameter analyzer was used to measure the drain current $I_d$ as a function of drain voltage $V_{ds}$ and gate voltage $V_{gs}$ at voltages from 0 V up to $V_{ds}$=$V_{gs}$=40 V. All measurements were carried out in the dark and in a nitrogen atmosphere. Values were extracted for the mobility and threshold voltage using the standard TFT analysis. The on/off ratio was defined as the ratio of the current at $V_{gs}$=40 V to the current at $V_{gs}$=0 V, at a constant $V_{ds}$=40 V. The $I_d$ curves for a typical device (#1) are illustrated in FIG. 2_a_, and the results from several devices are summarized in Table 7. The mobility in the saturation regime, $\mu_{sat}$, was typically 0.8±0.2 $cm^2$/Vs, and the on/off ratio$\geqq 10^5$.

TABLE 7

Summary of TFT characteristics for bottom gate geometry before lamination of dielectric.

| Transistor | $\square_{sat}$ (cm$^2$/Vs) | On/Off ratio | $V_{t,sat}$ |
|---|---|---|---|
| 1 | 1.01 | 7.1E+05 | 12.5 |
| 2 | 0.72 | 1.5E+05 | 15.5 |
| 3 | 0.70 | 5.6E+05 | 16.3 |
| 4 | 0.54 | 6.7E+04 | 16.9 |
| 5 | 0.67 | 1.0E+05 | 17.8 |
| 6 | 1.08 | 3.9E+05 | 14.9 |
| Median | 0.71 | 2.7E+05 | 15.9 |
| Average | 0.79 | 3.3E+05 | 15.7 |
| s.d. | 0.21 | 2.7E+05 | 1.9 |

TABLE 8a

Summary of TFT characteristics after lamination of dielectric and evaporation of second gate.

| Transistor | $\square_{sat}$ (cm$^2$/Vs) | $\square_{lin}$ (cm$^2$/Vs) | ON/Off ratio | $V_{t,\ sat}$ | $V_{t,\ lin}$ |
|---|---|---|---|---|---|
| 1 | 1.14 | 1.92 | 1.2E+03 | 6.4 | 15.6 |
| 2 | 0.69 | 1.22 | 5.8E+03 | 9.3 | 17.5 |
| 3 | 0.67 | 1.44 | 1.6E+04 | 10.2 | 18.8 |
| 4 | 0.61 | 1.31 | 2.2E+04 | 10.0 | 19.0 |
| 5 | 0.63 | 1.66 | 4.6E+04 | 8.3 | 18.4 |
| 6 | 1.03 | 2.26 | 4.7E+04 | 7.5 | 17.6 |
| Median | 0.68 | 1.55 | 1.9E+04 | 8.8 | 18.0 |
| Average | 0.80 | 1.64 | 2.3E+04 | 8.6 | 17.8 |
| s.d. | 0.23 | 0.40 | 2.0E+04 | 1.5 | 1.3 |

To complete the DIGFET structures, a film of poly (tetrafluoroethylene-co-vinylidenefluoride-co-propylene) was laminated by the process of this invention directly onto the CdS surface. This terpolymer was used as received from Aldrich. To produce the film, a 5 wt % solution in methylethylketone was bar-coated with a #12 Meyer rod onto Elvax® 550/Cronar® base sheet to produce a 450 nm thick film. The lamination was performed in a Carver press at 30 PSI with the sample between sheets of foam rubber to ensure even distribution of the applied force. The platens of the press were heated to 85° C. For the devices described here, two layers of the dielectric were laminated in succession, resulting in a total thickness d=0.9 □m. After lamination, isolated gold gate electrodes were evaporated onto the dielectric above each source-drain electrode pair. From ac impedance measurements on additional films of the terpolymer, it was determined that its dielectric constant k=6 at low frequencies (down to 40 Hz). This value was used to extract the mobility from the top-gate devices.

Once the dual-gate structures were completed, the transistor characteristics for the bottom-gate devices were checked again. A summary of these results is included in Table 8a. The mobility was largely unaffected by the addition of the polymer layer, but the threshold voltage was approximately halved to 8.8±1.5 V, and the on/off ratio was reduced by an order of magnitude.

The procedures for electrical measurements and analysis on the top-gate devices were identical to those used for the bottom-gate ones. FIG. 2*b* shows the bottom-gate drain current characteristics for device #1. For comparison, the top-gate behavior (post-lamination) of the same device is shown in FIG. 2*c*. Table 8b summarizes the top-gate and post-lamination bottom-gate results (for the same set of devices reported in Table 7).

TABLE 8b

Summary of TFT characteristics after lamination of dielectric. The uncertainties given in the averages represent the standard deviation for the data shown.

| | $\square_{sat}$ (cm$^2$/Vs) | | On/Off ratio | | $V_T$ | |
|---|---|---|---|---|---|---|
| Transistor | Top-gate | Bottom-gate | Top-gate | Bottom-gate | Top-gate | Bottom-gate |
| 1 | 0.12 | 1.14 | $1.3 \times 10^2$ | $1.2 \times 10^3$ | 0.5 | 6.4 |
| 2 | 0.044 | 0.69 | $2.3 \times 10^3$ | $5.8 \times 10^3$ | 7.6 | 9.3 |
| 3 | 0.017 | 0.67 | $5.2 \times 10^2$ | $1.6 \times 10^4$ | 6.1 | 10.2 |
| 4 | 0.012 | 0.61 | $3.8 \times 10^2$ | $2.2 \times 10^4$ | 0.2 | 10.0 |
| 5 | 0.032 | 0.63 | $9.8 \times 10^2$ | $4.6 \times 10^4$ | 11.4 | 8.3 |
| 6 | 0.071 | 1.03 | $2.0 \times 10^3$ | $4.7 \times 10^4$ | 9.4 | 7.5 |
| Average | .05(4) | .8(2) | $1.1(9) \times 10^3$ | $2(2) \times 10^4$ | 6(5) | 9(2) |

What is claimed is:

1. A process for laminating a layer of dielectric material onto a semiconductor comprising:

a. coating a first surface of a flexible substrate with a cushion layer comprising an elastomer to form a backing layer;

b. coating the cushion layer with a dielectric material to form a donor element comprising the substrate, the cushion layer and the dielectric material, wherein the dielectric material has a Tg below a lamination temperature;

c. placing the dielectric material of the donor element in contact with a semiconductor;

d. applying heat and pressure to a second surface of the substrate of the donor element to adhere the dielectric material to the semiconductor thereby transferring the dielectric material to the semiconductor; and optionally removing the backing layer.

2. The process of claim 1 wherein the substrate is selected from the group consisting of polymer films, polymer sheets, metal films and metal sheets.

3. The process of claim 1 wherein the cushion layer is an elastomer.

4. The process of claim 1 wherein the dielectric is selected from the group consisting of PBMA (polybutylmethacrylate), PVP (polyvinylpyridine), PTFEVFP (poly(tetrafluoroethylene-co-vinylidene fluoride-co-propylene)) and PVFMVE (poly(vinylidene fluoride-co-perfluoromethylvinylether)).

5. The process of claim 1 wherein the dielectric is a fluorinated polymer.

* * * * *

UNITED STATES PATENT AND TRADEMARK OFFICE

CERTIFICATE OF CORRECTION

PATENT NO. : 6,989,336 B2
DATED : January 24, 2006
INVENTOR(S) : Meth Jeffrey Scott et al.

It is certified that error appears in the above-identified patent and that said Letters Patent is hereby corrected as shown below:

Column 2,
Line 58, "between 40 C and" should read -- between 40°C and --.

Column 3,
Line 29, "A Teflon O-ring" should read -- A Teflon® O-ring --.
Line 50, "sheet of Teflon (the" should read -- sheet of Teflon® (the --.
Line 55, "by the Teflon sheet" should read -- by the Teflon® sheet --.

Column 4,
Line 24, "W=500 □m wide" should read -- W=500 $\mu$m wide --.
Line 26, "and 100 □m." should read -- and 100 $\mu$m. --.
Line 39, "from 0.2-1.5 □m on the" should read -- from 0.2-1.5 $\mu$m on the --.

Column 5,
Line 2, "d=1.8 □m, and" should read -- d=1.8 $\mu$m, and --.
Line 13, "mobility □$_{gb}$ and" should read -- mobility $\mu_{gb}$ and --.
Line 15, "in □ for the" should read -- in $\mu$ for the --.
Table 1, heading second column, "□ x $10^{-2}$)" should read -- $\mu$ x $10^{-2}$) --.
Table 1, heading fourth column, "□$_{gb}$" should read -- $\mu_{gb}$ --.
Line 56, "d=1.6 □m thick" should read -- d=1.6 $\mu$m thick --.

Column 6,
Table 2, heading second column, "□ x $10^{2}$)" should read -- $\mu$ x $10^{2}$) --.
Table 2, heading fourth column, "□ x $10^{2}$)" should read -- $\mu$ x $10^{2}$) --.
Table 3, heading third column, "(□m)" should read -- ($\mu$m) --.
Table 3, heading fourth column, "□$_{lin}$" should read -- $\mu_{lin}$ --.
Table 3, heading fifth column, "□$_{sat}$" should read -- $\mu_{sat}$ --.
Line 56, "d=1.5 □m." should read -- d=1.5 $\mu$m. --.
Table 4, heading third column, "Peak mobility □" should read -- Peak mobility $\mu$ --.

Column 7,
Table 4, heading third column, "Peak mobility □" should read -- Peak mobility $\mu$ --.
Table 5, heading third column, "(□m)" should read -- ($\mu$m) --.
Table 5, heading fourth column, "□$_{lin}$" should read -- $\mu_{lin}$ --.
Table 5, heading fifth column, "□$_{sat}$" should read -- $\mu_{sat}$ --.
Line 44, "(L=50 □m," should read -- (L=50 $\mu$m, --.
Line 45, "□m)" should read -- $\mu$m) --.
Table 6, heading second column, "Mobility □" should read -- Mobility $\mu$ --.

UNITED STATES PATENT AND TRADEMARK OFFICE

CERTIFICATE OF CORRECTION

PATENT NO. : 6,989,336 B2

DATED : January 24, 2006

INVENTOR(S) : Meth Jeffrey Scott et al.

It is certified that error appears in the above-identified patent and that said Letters Patent is hereby corrected as shown below:

Column 8,

Line 14, “in a Teflon” should read -- in a Teflon® --.

Line 21, “(P~$10^{18}$” should read -- (P~$10^{1B}$ --.

Line 22, “□-cm).” should read -- Ω-cm). --.

Line 49, “W=500 □m,” should read -- W=500 $\mu$m, --.

Line 50, “and 100 □m” should read -- and 100 $\mu$m --.

Column 9,

Table 7, heading second column, “$□_{sat}$” should read -- $\mu_{sat}$ --.

Line 51, “d=0.9 □m” should read -- d=0.9 $\mu$m --.

Column 10,

Table 8a, heading second column, “$□_{sat}$” should read -- $\mu_{sat}$ --.

Table 8a, heading third column, “$□_{lin}$” should read -- $\mu_{lin}$ --.

Table 8b, heading second column, “$□_{sat}$” should read -- $\mu_{sat}$ --.

Signed and Sealed this

Thirteenth Day of June, 2006

JON W. DUDAS

*Director of the United States Patent and Trademark Office*